(12) United States Patent
Wolford

(10) Patent No.: US 6,452,865 B1
(45) Date of Patent: Sep. 17, 2002

(54) METHOD AND APPARATUS FOR SUPPORTING N-BIT WIDTH DDR MEMORY INTERFACE USING A COMMON SYMMETRICAL READ DATA PATH WITH 2N-BIT INTERNAL BUS WIDTH

(75) Inventor: Barry Joe Wolford, Austin, TX (US)

(73) Assignee: International Business Machines Corporation, Armonk, NY (US)

(\*) Notice: Subject to any disclaimer, the term of this patent is extended or adjusted under 35 U.S.C. 154(b) by 0 days.

(21) Appl. No.: 09/925,267

(22) Filed: Aug. 9, 2001

(51) Int. Cl.[7] .............................................. G06F 12/08
(52) U.S. Cl. ............. 365/233; 365/189.01; 365/189.08; 365/189.05; 711/154; 711/167; 711/169
(58) Field of Search ...................... 365/189.01, 230.01, 365/233, 189.05, 189.08; 711/154, 167, 169

(56) References Cited

U.S. PATENT DOCUMENTS

| | | | | | |
|---|---|---|---|---|---|
| 5,991,232 A | * | 11/1999 | Matsumara | ................. | 365/233 |
| 6,029,252 A | * | 2/2000 | Manning | ........................... | 1/1 |
| 6,252,788 B1 | * | 6/2001 | Maesako et al. | ....... | 365/189.01 |
| 6,266,750 B1 | * | 7/2001 | DeMone et al. | .............. | 711/69 |
| 6,337,809 B1 | * | 1/2002 | Kim et al. | ............. | 365/189.05 |
| 6,339,817 B1 | * | 1/2002 | Maesako et al. | ....... | 365/189.04 |
| 6,377,501 B2 | * | 4/2002 | Maesako et al. | ....... | 365/230.03 |

\* cited by examiner

*Primary Examiner*—Viet Q. Nguyen
(74) *Attorney, Agent, or Firm*—Carr Law Firm, L.L.P.; Robert M. Carwell

(57) ABSTRACT

A single common symmetrical DDR read data path structure and corresponding storage addressing scheme is provided for implementing both N-bit and (N/2)-bit interfaces to a DDR memory. The read data path structure of the present invention uses a feedback loop of a lower data path to a higher data path in conjunction with the translation of the physical addressing of the data stored into a memory. The feedback loop and address translation mechanism is enabled for (N/2)-bit mode and disabled for N-bit mode. Normally, a multiplexer controlled by a static control is used to change the bit mode.

17 Claims, 3 Drawing Sheets

METHOD AND APPARATUS FOR SUPPORTING N-BIT WIDTH DDR MEMORY INTERFACE USING A COMMON SYMMETRICAL READ DATA PATH WITH 2N-BIT INTERNAL BUS WIDTH

BACKGROUND OF THE INVENTION

1. Field of the Invention

The invention relates generally to a double data rate (DDR) synchronous random access memory (SDRAM) interface and, more particularly, to a single common symmetrical memory read data path used for DDR memory controller designs supporting both N-bit and N/2-bit external memory data path widths interfacing to 2N width internal buses.

2. Description of the Related Art

In a DDR SDRAM, data is stored in memory at the address corresponding to the data, and the address is aligned to the width of the memory interface. In N-bit mode, data is stored at addresses that reside on N-bit boundaries, with byte selects used to mask and/or enable the individual bytes. Likewise, in (N/2)-bit mode, data is typically stored at addresses that reside on (N/2)-bit boundaries, with byte selects used to mask and/or enable the individual bytes.

For example, in 64-bit mode, data is stored at addresses that reside on 64-bit (8-byte) boundaries, with byte selects used to mask/enable the individual bytes within an 8 byte Doubleword (DW). In other words, DWs are stored on 8-byte boundaries with DW0 stored at address 0, DW1 stored at address 8, etc. Likewise, in 32-bit mode, data is typically stored at addresses that reside on 32-bit (4-byte) boundaries, with byte selects used to mask and/or enable the individual bytes within a 4-byte Word (W). In other words, Words are stored on 4-byte boundaries with W0 stored at address 0, W1 stored at address 4, W2 stored at address 8, W3 stored at address C, etc.

Typically, storing data in (N/2)-bit mode requires additional logic and multiplexing that increases the overall path delays along the DDR read data critical path. Additionally, more complex dynamic multiplexer control (DC) logic is required to enable the capture and steering of the read data. The end result of this is increased delays, increased logic power within the read data path, asymmetrical fan-out that affects both (N/2)-bit and N-bit mode timing, increased physical design complexity and time, and more complex static timing analysis assertion and timing runs.

Therefore, there is a need for a single common symmetrical DDR read data path that can be used for both N-bit and (N/2)-bit memory interfaces.

SUMMARY OF THE INVENTION

The present invention provides a read data path structure that can be used for N-bit and (N/2)-bit memory interfaces to a double data rate (DDR) synchronous random access memory (SDRAM). The read data path structure comprises a first flip-flop (FF) receiving lower (N/2)-bit data, a second FF having its input connected to the output of the first FF, and a third FF having its input connected to the output of the second FF. The read data path structure further comprises a first multiplexer having three inputs connected to the output of the first FF, the output of the second FF, and the output of the third FF, a fourth FF having its input connected to the output of the first multiplexer, and a fifth FF receiving upper (N/2)-bit data.

Additionally, the read data path structure comprises a sixth FF having its input connected to the output of the fifth FF, a seventh FF having its input connected to the output of the sixth FF, and a second multiplexer having four inputs connected to the output of the fourth FF, the output of the fifth FF, the output of the sixth FF, and the output of the seventh FF.

Also, the read data path structure comprises an eighth FF having its input connected to the output of the second multiplexer.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

The present invention provides common symmetrical DDR read data path that can be used for N-bit and (N/2)-bit memory interfaces. When in (N/2)-bit mode, data is stored at a modified (N/2)-bit aligned address (with respect to the system address) within the aligned 2N-bit address of the data transfer. Within each 2N-bit aligned address, there are four (N/2)-bit aligned address boundaries. In the preferred embodiment, the effective store address translation for the (N/2)-bit mode is achieved by "steering" the store data to the appropriate lanes within the DDR write data path such that the data is stored into the modified address location within the DDR memory.

For example, when operating in (N/2)-bit mode where N=64, the store data would be steered to the corresponding memory address as indicated in the following table:

| Memory Word Address | 0(x00) | 1(x04) | 2(x08) | 3(x0C) |
| --- | --- | --- | --- | --- |
| Store Data | Word 1 | Word 3 | Word 0 | Word 2 |

Figure 1:
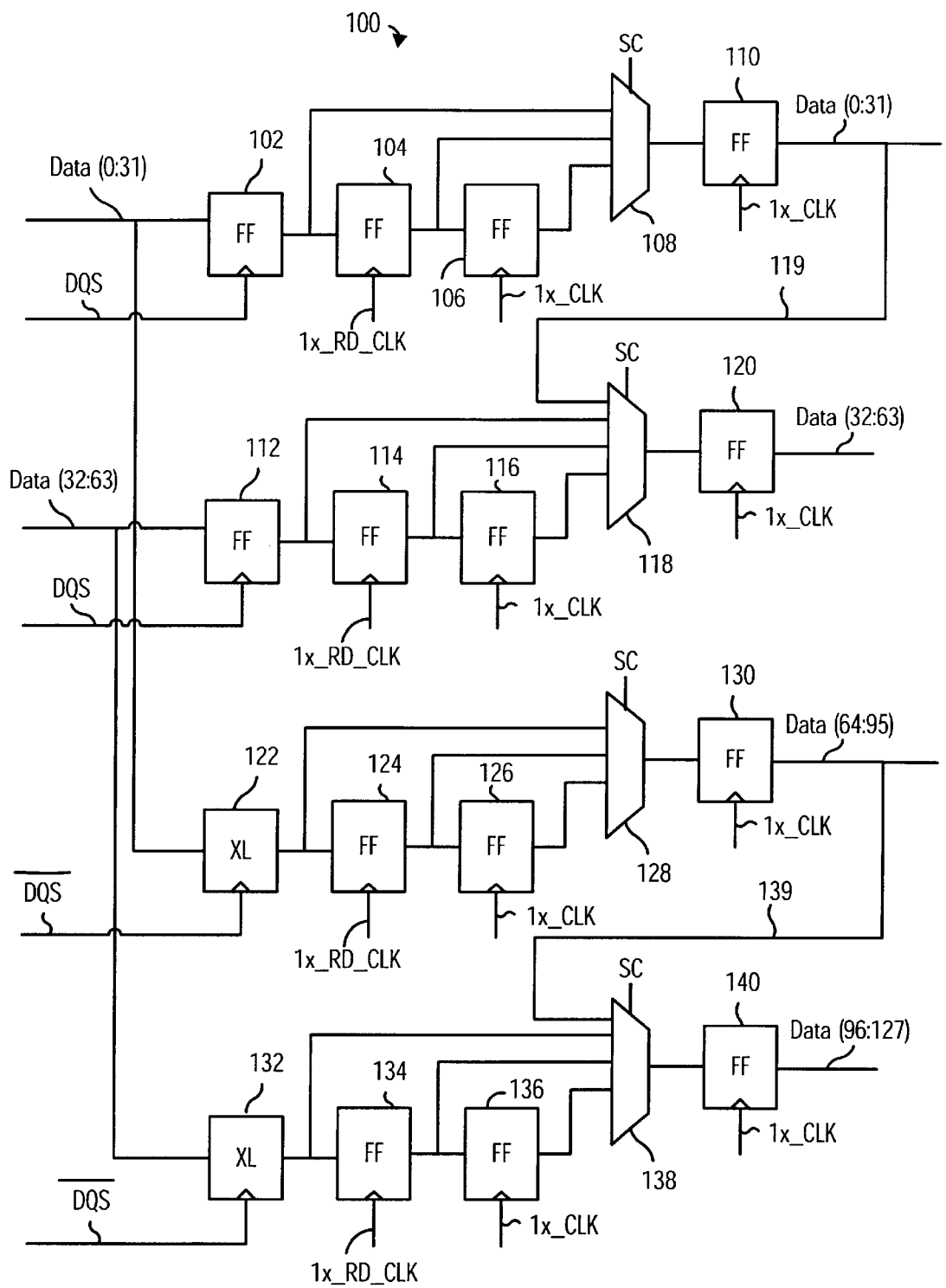
FIG. 1 depicts an exemplary single common symmetrical DDR read data path structure that can be used for both (N/2)-bit mode and N-bit mode, when N=64.
Figure 2:
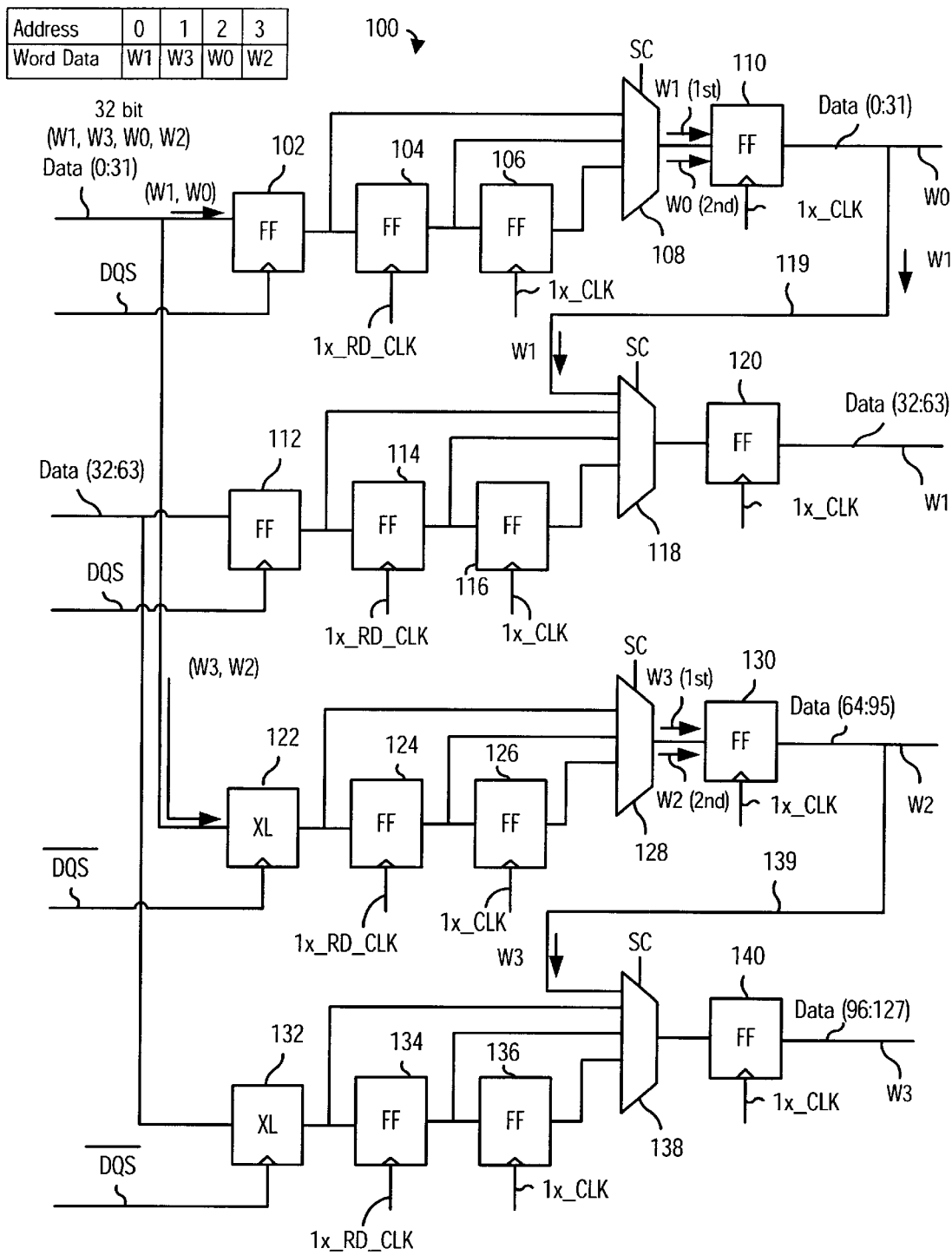
FIG. 2 depicts an exemplary (N/2)-bit Word DDR read data flow, when N=64.
Figure 3:
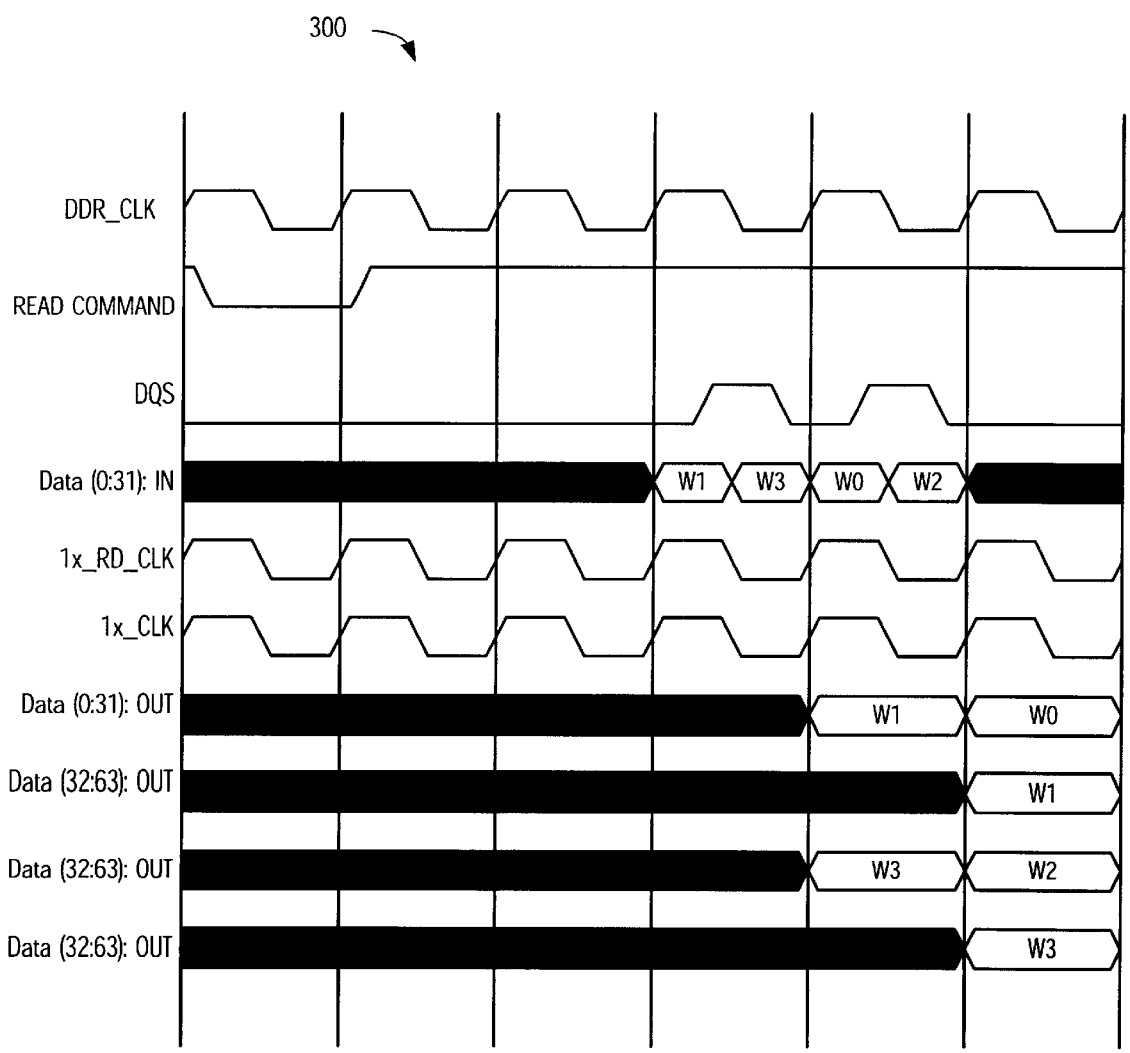
FIG. 3 depicts (N/2)-bit Word DDR read data flow timing diagram corresponding to FIG. 2.

For ease of discussion and explanation of the present invention, the following discussion and FIGS. 1–3 describe the present invention when N=64. The data will be stored in memory, when in 32-bit mode, as disclosed above, to enable the use and implementation of a single DDR read data path for a controller supporting both 64-bit and 32-bit modes of operation. The present invention,however, is not limited to cases when N=64. For example, for N=128, when operating in 64-bit mode, the store data will be steered to the corresponding memory address as indicated in the following table:

| Memory Doubleword Address | 0(x00) | 1(x08) | 2(x10) | 3(x18) |
| --- | --- | --- | --- | --- |
| Store Data | Doubleword 1 | Doubleword 3 | Doubleword 0 | Doubleword 2 |

Preferably, the data read path is a single symmetrical read data path structure to allow for a more efficient implementation of the physical interface layer of the DDR memory controller's read data path. Specifically, the off-chip, package, and on-chip physical wire delays (and loading) should match for all bits (signals) within a DDR channel (defined as the DDR read data byte and its associated read data strobe (DQS)) and for all bits (signals) from DDR channel to DDR channel across the memory interface along the critical path.

The principles of the present invention and their advantages are best understood by referring to the illustrated operations of embodiment depicted in FIGS. 1–3. In FIG. 1, DDR read data is input to the left of the data path and output at the right of the data path. Also, Data (n:m) indicates DDR read data from bit n to bit m. For example, Data (0:31) indicates DDR read data from bit 0 to bit 31 (32 bits).

In FIG. 1, the reference numeral 100 designates a circuit describing an exemplary single common symmetrical DDR read data path structure that can be used for both (N/2)-bit mode and N-bit mode, when N=64.

A flip-flop (FF) 102 receives Data (0:31) through its input. The output of the FF 102 is connected to the input of a FF 104. The input of a FF 106 is connected to the output of the FF 104. A multiplexer 108, controlled by a static control signal (SC), has three inputs connected to the outputs of the FF 102, the FF 104, and the FF 106. A FF 110 receives the output of the multiplexer 108. The FF 110 outputs Data (0:31).

A FF 112 receives Data (32:63) through its input. The input of a FF 114 is connected to the output of the FF 112. The input of a FF 116 is connected to the output of the FF 114. A multiplexer 118, controlled by an SC, has four inputs connected to the outputs of the FF 110, the FF 112, the FF 114, and the FF 116. Note here that one input of the multiplexer 118 is connected to the output of the FF 110 through a feedback path 119. The input of a FF 120 is connected to the output of the multiplexer 118. The FF 120 outputs Data (32:63).

An XL 122 receives Data (0:31) through its input. The output of the XL 122 is connected to the input of a FF 124. The input of a FF 126 is connected to the output of the FF 124. A multiplexer 128, controlled by an SC, has three inputs connected to the outputs of the XL 122, the FF 124, and the FF 126. A FF 130 receives the output of the multiplexer 128. The FF 130 outputs Data (64:95).

An XL 132 receives Data (32:63) through its input. The input of a FF 134 is connected to the output of the XL 132. The input of a FF 136 is connected to the output of the FF 134. A multiplexer 138, controlled by an SC, has four inputs connected to the outputs of the FF 130, the XL 132, the FF 134, and the FF 136. Note here that one input of the multiplexer 138 is connected to the output of the FF 110 through a feedback path 139. The input of a FF 140 is connected to the output of the multiplexer 138. The FF 140 outputs Data (96:127).

The FFs 102 and 112 are clocked by a read data strobe (DQS), whereas the XLs 122 and 132 are clocked by an inverted DQS. The FFs 104, 114, 124, and 134 are clocked by 1x_RD_CLK, whereas the FFs 106, 110, 116, 120, 126, 130, 136, and 140 are clocked by an internal 1x_CLK.

Read data is sampled in the first stage with the DQS signal. Two bits of DDR data per pin are received per DDR clock cycle and the rising edge of the DQS signal is used to sample the "upper" read data bus at the FFs 102 and 112 and the falling edge of the DQS signal is used to capture the "lower" read data bus at the XLs 122 and 132. The FFs 102 and 112 capture Data (0:31) and Data (32:63), respectively, on the rising edge of the clock. Likewise, the XLs 122 and 132 flush when the clock is high and hold when the clock is low. DDR read data is synchronized with the internal clock domain locally in the FFs 104, 106, 114, 116, 124, 126, 134, and 136, or downstream at the sample point in the FFs 110, 120, 130, and 140. The multiplexer controls at the multiplexers 108, 118, 128, and 138 are static in that the sample stage select is configured for the application timings following power-on reset of the controller and remains static.

When in 32-bit mode, the only DDR read data path connections to the external memory are on Data (0:31). Data travels through the "cross-hatched" register stages exclusively in 32-bit mode and must be steered to the appropriate Word lanes for transfer on the internal 128-bit data bus. As depicted in FIG. 1, the "steering" of the read data occurs following the synchronization stage (rightmost stage) and is fed back along a non-critical data path through the multiplexers 118 and 138. The SCs for the feedback data are determined based on the mode of operation. In 64-bit mode, the multiplexers 118 and 138 cannot select the feedback paths 119 and 139, respectively. In 32-bit mode, the multiplexers 118 and 138 are switched to always select the feedback paths 119 and 139, respectively, to enable the read data to be steered to the appropriate Word lanes.

Now referring to FIG. 2, the circuit 100 of FIG. 1 is used to depict a data flow through the DDR read data path for 32-bit mode with data stored in memory as indicated in the table shown in FIG. 2. As shown in the table shown in FIG. 2, the numbers 0, 1, 2, and 3 in FIG. 2 indicate Word addresses, whereas W1, W2, W3, and W4 indicate Word data. The actual addresses of the Word data W1, W2, W3, and W4 are 0, 1, 2, and 3, respectively. In the table shown in FIG. 2, however, the Word data W1, W2, W3, and W4 are stored at Addresses 2, 0, 3, and 1, respectively. As mentioned above, by storing a Word data at a modified or translated address different than its actual system address, allows a common symmetrical DDR read data path for N-bit and an (N/2)-bit memory interface.

As depicted in the upper left of FIG. 2, Word data 1, 3, 0, and 2 are read from memory to the first stage of the circuit 100. The synchronization (rightmost) stage is used to hold Words 1 and 3 so that they may be steered to the proper Word lanes in the following cycle to allow the entire 128-bit (4-Word) transfer.

In the exemplary Word data flow shown in FIG. 2, Word data 1 and 0 are input to the FF 102. Since this is 32-bit mode, there is no valid input to the FF 112 and the XL 132. First, Word data 1 is input to the FF 110, followed by Word data 0. At the next clock cycle, Word data 1 is present at the output of the FF 110. At this time, there is no valid output at the output of the FF 120. At the next clock cycle, the Word data 1 is input to the FF 120 through the multiplexer 118. Since this is 32-bit mode, the SC controlling the multiplexer 118 switches the multiplexer 118 to always select the feedback path 119. Therefore, at this clock cycle, Data (32:63) contains Word data 1, while Data (0:31) contains Word data 0.

Similarly, Word data 3 and 2 are input to the XL 122. Since this is 32-bit mode, there is no valid input to the FF 112 and the XL 132. First, Word data 3 is input to the FF 130, followed by Word data 2. At the next clock cycle, Word data 3 is present at the output of the FF 130. At this time, there is no valid output at the output of the FF 140. At the next clock cycle, the Word data 3 is input to the FF 140 through the multiplexer 138. Since this is 32-bit mode, the SC controlling the multiplexer 138 switches the multiplexer 138 to always select the feedback path 139. Therefore, at this clock cycle, Data (96:127) contains Word data 3, while Data (64:95) contains Word data 2.

FIG. 3 depicts this same example used in FIG. 2 in a timing diagram 300 for 32-bit Word DDR read data flow.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A read data path structure that can be used for N-bit and (N/2)-bit memory interfaces to a double data rate (DDR) synchronous random access memory (SDRAM), the read data path structure comprising:
   a first flip-flop (FF) receiving lower (N/2)-bit data;
   a second FF having its input connected to the output of the first FF;
   a third FF having its input connected to the output of the second FF;
   a first multiplexer having three inputs connected to the output of the first FF, the output of the second FF, and the output of the third FF;
   a fourth FF having its input connected to the output of the first multiplexer;
   a fifth FF receiving upper (N/2)-bit data;
   a sixth FF having its input connected to the output of the fifth FF;
   a seventh FF having its input connected to the output of the sixth FF;
   a second multiplexer having four inputs connected to the output of the fourth FF, the output of the fifth FF, the output of the sixth FF, and the output of the seventh FF; and
   an eighth FF having its input connected to the output of the second multiplexer.

2. The read data path structure of claim 1, further comprising:
   a first transparent latch (XL) receiving lower (N/2)-bit data;
   a ninth FF having its input connected to the output of the first XL;
   a tenth FF having its input connected to the output of the ninth FF;
   a third multiplexer having three inputs connected to the output of the first XL, the output of the ninth FF, and the output of the tenth FF;
   an eleventh FF having its input connected to the output of the third multiplexer;
   a second XL receiving upper (N/2)-bit data;
   a twelfth FF having its input connected to the output of the second XL;
   a thirteenth FF having its input connected to the output of the twelfth FF;
   a fourth multiplexer having four inputs connected to the output of the eleventh FF, the output of the second XL, the output of the twelfth FF, and the output of the thirteenth FF; and
   a fourteenth FF having its input connected to the output of the fourth multiplexer.

3. The read data path structure of claim 2, wherein the third and fourth multiplexers are controlled by third and fourth static controls, respectively.

4. The read data path structure of claim 2, wherein the third and fourth multiplexers are controlled by third and fourth static controls, respectively, and wherein the read data path structure is set as a (N/2)-bit mode by switching the fourth multiplexer to transmit the output of the eleventh FF.

5. The read data path structure of claim 2, wherein the first and second XLs are clocked by an inverted DQS.

6. The read data path structure of claim 2, wherein N equals 64.

7. The read data path structure of claim 1, wherein the first and second multiplexers are controlled by first and second static controls, respectively.

8. The read data path structure of claim 1, wherein the first and second multiplexers are controlled by first and second static controls, respectively, and wherein the read data path structure is set as a (N/2)-bit mode by switching the second multiplexer to transmit the output of the fourth FF.

9. The read data path structure of claim 1, wherein the first and fifth FFs are clocked by a read data strobe (DQS).

10. The read data path structure of claim 1, wherein N equals 64.

11. The read data path structure of claim 1, wherein the lower (N/2)-bit data and the upper (N/2)-bit data are stored at translated addresses of the DDR SDRAM when the second multiplexer is switched to output the output signal of the fourth FF, the translated address being different from the actual system address for the lower (N/2)-bit data and the upper (N/2)-bit data.

12. A read data path structure that can be used for N-bit and (N/2)-bit memory interfaces to a double data rate (DDR) synchronous random access memory (SDRAM), the read data path structure comprising:
   a first flip-flop (FF) receiving lower (N/2)-bit data;
   a second FF having its input connected to the output of the first FF;
   a third FF having its input connected to the output of the second FF;
   a first multiplexer having three inputs connected to the output of the first FF, the output of the second FF, and the output of the third FF;
   a fourth FF having its input connected to the output of the first multiplexer;
   a fifth FF receiving upper (N/2)-bit data;
   a sixth FF having its input connected to the output of the fifth FF;
   a seventh FF having its input connected to the output of the sixth FF;
   a second multiplexer having four inputs connected to the output of the fourth FF, the output of the fifth FF, the output of the sixth FF, and the output of the seventh FF;
   an eighth FF having its input connected to the output of the second multiplexer.
   a first transparent latch (XL) receiving lower (N/2)-bit data;
   a ninth FF having its input connected to the output of the first XL;
   a tenth FF having its input connected to the output of the ninth FF;
   a third multiplexer having three inputs connected to the output of the first XL, the output of the ninth FF, and the output of the tenth FF;
   an eleventh FF having its input connected to the output of the third multiplexer;
   a second XL receiving upper (N/2)-bit data;

a twelfth FF having its input connected to the output of the second XL;

a thirteenth FF having its input connected to the output of the twelfth FF;

a fourth multiplexer having four inputs connected to the output of the eleventh FF, the output of the second XL, the output of the twelfth FF, and the output of the thirteenth FF; and a fourteenth FF having its input connected to the output of the fourth multiplexer.

13. The read data path structure of claim 12, wherein the first, second, third, and fourth multiplexers are controlled by first, second, third, and fourth static controls, respectively.

14. The read data path structure of claim 12, wherein the first, second, third, and fourth multiplexers are controlled by first, second, third, and fourth static controls, respectively, and wherein the read data path structure is set as a (N/2)-bit mode by switching the second and fourth multiplexers to transmit the output of the third FF and the output of the ninth FF, respectively.

15. The read data path structure of claim 12, wherein the first and fifth FFs are clocked by a DQS, and wherein the first and second XLs are clocked by an inverted DQS.

16. The read data path structure of claim 12, wherein N equals 64.

17. The read data path structure of claim 12, wherein the lower (N/2)-bit data and the upper (N/2)-bit data are stored at translated addresses of the DDR SDRAM when the second and fourth multiplexers are switched to output the output signal of the fourth FF and the output signal of the eleventh FF, respectively, the translated address being different from the actual system address for the lower (N/2)-bit data and the upper (N/2)-bit data.

* * * * *